US011610029B2

(12) United States Patent
Jalla

(10) Patent No.: US 11,610,029 B2
(45) Date of Patent: Mar. 21, 2023

(54) METHOD AND SYSTEM FOR IDENTIFYING CONFLICTS WITHIN ROOF TRUSS OF A STRUCTURE

(71) Applicant: Consulting Engineers, Corp., Reston, VA (US)

(72) Inventor: Maharaj Jalla, Great Falls, VA (US)

(73) Assignee: Consulting Engineers, Corp., Reston, VA (US)

( * ) Notice: Subject to any disclaimer, the term of this patent is extended or adjusted under 35 U.S.C. 154(b) by 17 days.

(21) Appl. No.: 16/801,154

(22) Filed: Feb. 26, 2020

(65) Prior Publication Data

US 2021/0141950 A1 May 13, 2021

Related U.S. Application Data

(63) Continuation-in-part of application No. 16/677,639, filed on Nov. 7, 2019, now Pat. No. 11,113,310.

(51) Int. Cl.
*G06F 30/13* (2020.01)
*G06T 19/20* (2011.01)

(52) U.S. Cl.
CPC .............. *G06F 30/13* (2020.01); *G06T 19/20* (2013.01); *G06T 2219/2004* (2013.01)

(58) Field of Classification Search
CPC .. G06F 30/13; G06T 19/20; G06T 2219/2004
See application file for complete search history.

(56) References Cited

U.S. PATENT DOCUMENTS

| 7,353,144 | B1 * | 4/2008 | Rinks ...................... | G06F 30/13 703/1 |
| 2004/0073410 | A1 * | 4/2004 | Maly ....................... | G06F 30/13 703/1 |
| 2008/0249749 | A1 * | 10/2008 | Egbertson ............... | G06F 30/13 703/1 |
| 2010/0024318 | A1 * | 2/2010 | Zhang ..................... | G06Q 10/00 52/79.5 |
| 2015/0254376 | A1 * | 9/2015 | Pettersson .............. | G06Q 10/06 703/1 |

* cited by examiner

*Primary Examiner* — Chuen-Meei Gan
(74) *Attorney, Agent, or Firm* — Andrew Morabito

(57) ABSTRACT

The present invention is a computer implemented method comprising: accessing a model of a building; isolating a set of roof trusses, wherein the roof trusses are comprised of members; analyzing each of the members and determining the actual properties of each of the members; comparing if the actual properties of the members are within a predetermined tolerance of a set of required properties for each of the members; and generating a list of all conflicting members.

15 Claims, 11 Drawing Sheets

METHOD AND SYSTEM FOR IDENTIFYING CONFLICTS WITHIN ROOF TRUSS OF A STRUCTURE

CROSS-REFERENCE TO RELATED APPLICATIONS

This application is a continuation-in-part (and claims the benefit of priority under 35 USC 120) of U.S. Pat. No. 1113310 issues on Sep. 7, 2021. The disclosure of the U.S. Pat. No. 1,113,310 is considered part of (and is incorporated by reference in) the disclosure of this application.

BACKGROUND

This disclosure relates generally to building construction and in particular, to the method, computer program, or computer system for providing the quality control of the material for the building construction and determining conflicts within the building construction.

A building typically has many different components, like foundation, walls, joists, trusses, sheathings many other different components. When these components are connect with each other in a proper format building is formed. Each individual component is made up of different assemblies and each assembly is made up of members. If each member is not as per the required specification or dimensions then it leads to form conflict. Conflict in the roof truss is occurred due to improper length of the member, individual member orientation, overlapping of the members, wrong positions of required cuts and service holes in the members. So checking of the each individual roof truss is very time consuming and critical task for the engineer.

During building construction, the connections and placing of each roof truss is vital to the safety and functionality of the roof, and to be considered for hassle and conflict free construction. The constructability of the roof trusses to avoid any conflict between any disciplines is critical aspect. Traditional method of reviewing the constructability checks for each individual truss and its members manually in the detailing software is time consuming and chances of error are more.

Therefore, it is beneficial to assist each of the truss members at the earliest stage to determine where issues exist and preemptively correcting these issues before construction begins.

SUMMARY

In a first embodiment, the present invention is a computer implemented method comprising: accessing, by at least one processor, a model of a building; isolating, by at least one processor, a set of roof trusses, wherein the roof trusses are comprised of members; analyzing, by at least one processor, each of the members and determining the actual properties of each of the members; comparing, by at least one processor, if the actual properties of the members are within a predetermined tolerance of a set of required properties for each of the members; and generating, by at least one processor, a list of all conflicting members.

In a second embodiment, the present invention is a computer program product comprising: a computer readable storage device readable by one or more processing circuit and storing instructions for execution by one or more processor for performing a method comprising: accessing a model of a building; isolating a set of roof trusses, wherein the roof trusses are comprised of members; analyzing each of the members and determining the actual properties of each of the members; comparing if the actual properties of the members are within a predetermined tolerance of a set of required properties for each of the members; and generating a list of all conflicting members.

In a third embodiment, the present invention is a system comprising: a memory; one or more processors in communication with the memory; program instructions executable by the one or more processors via the memory to perform a method, the method comprising: accessing a model of a building; isolating a set of roof trusses, wherein the roof trusses are comprised of members; analyzing each of the members and determining the actual properties of each of the members; comparing if the actual properties of the members are within a predetermined tolerance of a set of required properties for each of the members; and generating a list of all conflicting members.

BRIEF DESCRIPTION OF THE DRAWINGS

Referring now to the drawings in which like reference numbers represent corresponding parts throughout.

DETAILED DESCRIPTION

Figure 1:
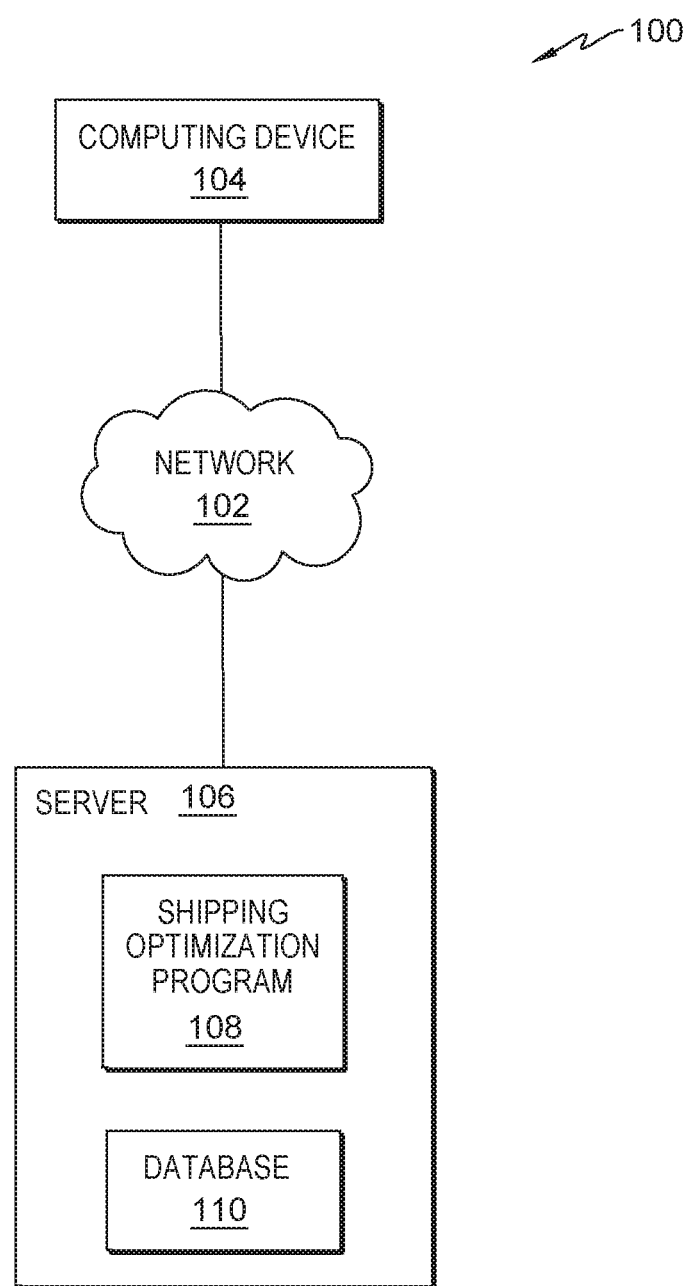
FIG. 1 depicts a block diagram depicting a computing environment, in accordance with one embodiment of the present invention.

The present invention generally relates to the process of analyzing a building to identify conflicts or design errors, and correcting the errors at the design stage so the construction can be completed with minimal or no issues. Through the location of the roof trusses, the identification of the roof truss members, and the analysis of the roof truss members to determine if they have the correct properties and if they are outside of the tolerance values, correcting the errors with the roof truss members.

The present invention uses the unique feature of analyzing the roof truss members and determining if there are any internal conflicts. The internal conflicts are related to the features (length, height, width, openings, cutouts, etc.) of the roof truss members. In instances where conflicts are identified with the roof truss member(s), they are added to a sick list, which identifies the conflicts of the roof truss member also shows the condition under which the given conflict occurs. The unique feature saves the time of review the building members and prepare conflict roof truss member sick list for the roof truss members and also eliminate the chance of error with the construction process.

In the typical construction process a model of the building (e.g. structure, home, office building, hospital, garage, barn, apartment building, etc.) is imported from third party software or created within the present system. The next step is to generate the manufacturing files for the roll forming machine. However, the generation of these manufacturing files is not advised or able to be completed until a verification of possible conflicts of the roof is completed. Otherwise the potential for cold formed steel members to be manufactured without the proper cutouts or design require either new parts need to be manufactured, or manual modification of the parts need to be completed on the job site. Both of these take time and additional resources to complete. The reviewing of the model from constructability aspect and identify the possible conflicts is a time consuming task before the roof truss members are manufactured. If the user is able to quickly identify the conflicts in the model, the entire process of constructing the building can be shortened.

The present invention provides for an advantage of allowing the review of the model by providing a unique process of constructability conflict check for the structural system, architectural system, mechanical system, electrical system, and plumbing system, and the like with reference to roof trusses. The roof truss members which have internal conflicts are identified, marked, and corrected.

The term "conflict" is used for any incidence, location, feature (e.g. properties) where any one member or element is not equal to or within the predetermined tolerance of the member properties. For example, a conflict may be the member is not at the required position, not within the required specifications, not adhering to predetermined codes, or the like.

As stated prior the advantage of this system is a specialized and specific assessment of the roof truss members real properties relative to a required set of properties, that provide the user with detailed information on the conflicts of each roof truss member, and an efficient solution to the conflicts. This provides a major cost and time saving feature when the construction of the building begins and during the process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

FIG. 1 depicts a block diagram of a computing environment 100 in accordance with one embodiment of the present invention. FIG. 1 provides an illustration of one embodiment and does not imply any limitations regarding the environment in which different embodiments maybe implemented.

In the depicted embodiment, computing environment 100 includes network 102, computing device 104, and server 106. Computing environment 100 may include additional servers, computers, or other devices not shown.

Network 102 may be a local area network (LAN), a wide area network (WAN) such as the Internet, any combination thereof, or any combination of connections and protocols that can support communications between computing device 104 and server 106 in accordance with embodiments of the invention. Network 102 may include wired, wireless, or fiber optic connections.

Computing device 104 may be a management server, a web server, or any other electronic device or computing system capable of processing program instructions and receiving and sending data. In other embodiments, computing device 104 may be a laptop computer, tablet computer, net book computer, personal computer (PC), a desktop computer, or any programmable electronic device capable of communicating with patient computing device 104 via network 102. In other embodiments, computing device 104 may be a server computing system utilizing multiple computers as a server system, such as in a cloud computing environment. In one embodiment, computing device 104 represents a computing system utilizing clustered computers and components to act as a single pool of seamless resources. Computing device 104 may include components, as depicted and described in further detail with respect to FIG. 1.

Server 106 may be a management server, a web server, or any other electronic device or computing system capable of processing program instructions and receiving and sending data. In other embodiments server 106 may be a laptop computer, tablet computer, net book computer, personal computer (PC), a desktop computer, or any programmable electronic device capable of communicating via network 102. In one embodiment, server 106 may be a server computing system utilizing multiple computers as a server system, such as in a cloud computing environment. In one embodiment, server 106 represents a computing system utilizing clustered computers and components to act as a single pool of seamless resources. In the depicted embodiment conflict identification program 108 and database 110 are located on server 106. Server 106 may include components, as depicted and described in further detail with respect to FIG. 1.

Conflict identification program 108 analyzes the roof truss members of a building and determines if the actual properties of the roof truss members are within the predetermined tolerances of the required roof truss member properties, and if it is determined that the roof truss members are not within the desired ranges, the conflicting roof truss members are identified and the conflicts are identified. In some embodiments, the conflict identification program 108 corrects the conflicts within the roof truss member.

The required values are known values from which certain roof truss members need to possess for the roof trusses to be manufactured and assembled with minimal to no issues. These values are associated with the various properties of the roof truss members. The properties relate to the features of the of the roof truss members. For example, the length, width, height, orientation, cutouts, dimples, openings, or the like. This also includes the position of the member within the model relative to the x, y, and z axes. This also includes how the roof truss members interact with other features or systems of the model, for example plumbing, electrical, HVAC, and the like. In some embodiments, the conflict identification program 108 accesses various building codes and laws of the state, local, or federal guidelines which are required to construct the building and applies these requirements.

Database 110 may be a repository that may be written to and/or read by Conflict identification program 108. Information gathered from computing device 104 and the 1-dimensional, 2-dimensional, and 3-dimensional drawings and models as well as the requirements so that the materials and members are identified as conflicting or non-conflicting. In one embodiment, database 110 is a database management system (DBMS) used to allow the definition, creation, querying, update, and administration of a database(s). In the depicted embodiment, database 110 resides on computing device 104. In other embodiments, database 110 resides on another server, or another computing device, provided that database 110 is accessible to Conflict identification program 108.

Figure 2:
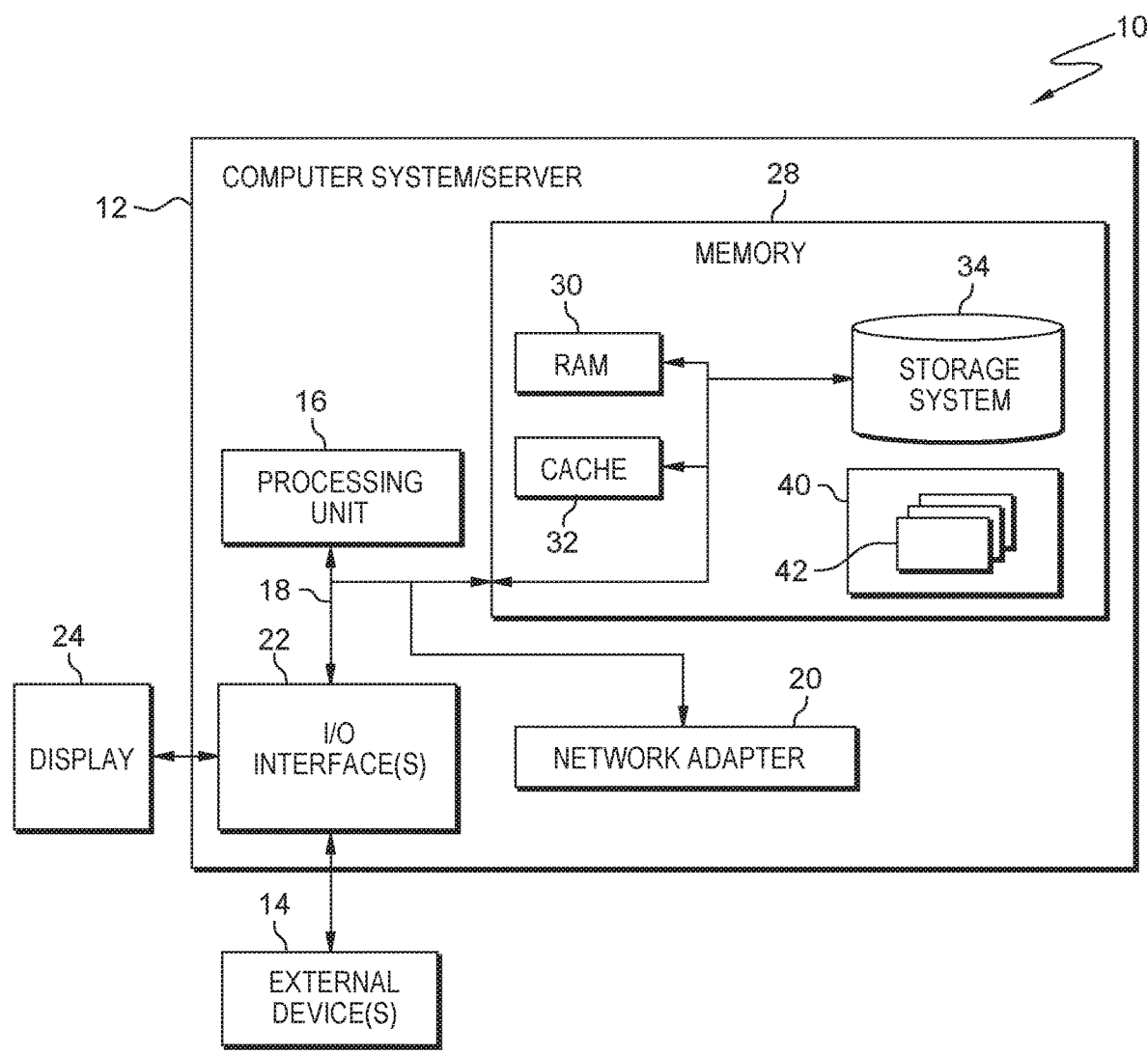
FIG. 2 depicts a block diagram depicting the internal and external components of the server and computing device of FIG. 1, in accordance with one embodiment of the present.

FIG. 2, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing environment 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

FIG. 2, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 3:
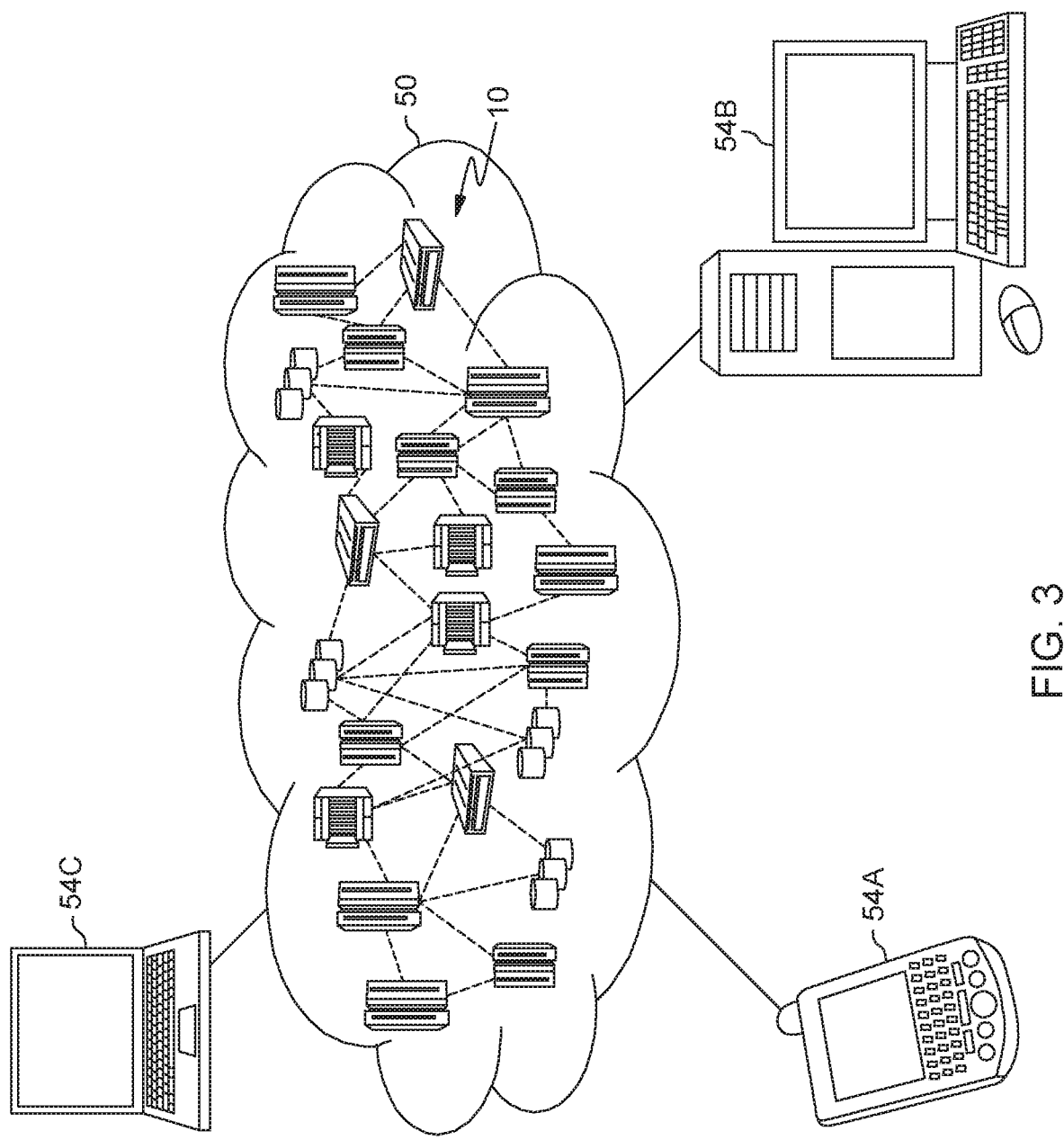
FIG. 3 depicts a cloud computing environment, in accordance with one embodiment of the present invention.

FIG. 3, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-C shown in FIG. 2 are intended to be illustrative only and that computing nodes 10 and cloud computing environment 50 can communicate with any type of computerized device over any type of network and/or network addressable connection (e.g., using a web browser).

Referring back to FIG. 2, the Program/utility 40 may include one or more program modules 42 that generally carry out the functions and/or methodologies of embodiments of the invention as described herein. Specifically, the program modules 42 many analyze a building model, identify the roof trusses and the roof truss members and determine if there is a conflict with the roof truss members internally based on a required set of values and a measured or actual set of values. Other functionalities of the program modules 42 are described further herein such that the program modules 42 are not limited to the functions described above. Moreover, it is noted that some of the modules 42 can be implemented within the infrastructure shown in FIGS. 1-3.

Figure 4:
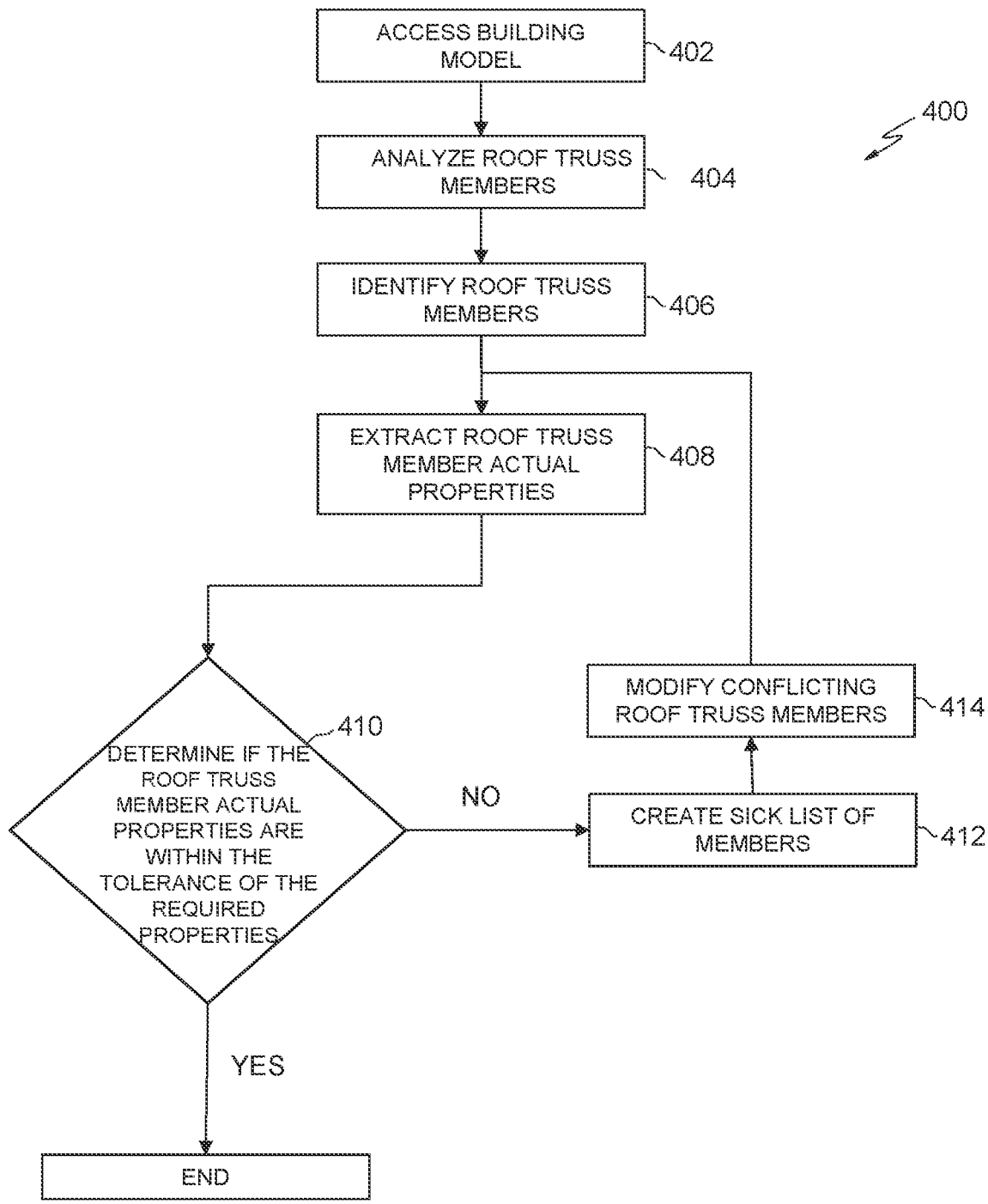
FIG. 4 depicts a flowchart of the operational steps of a method for determining the directional conflict checks for trusses in building within the computing environment of FIG. 1, in accordance with one embodiment of the present invention

FIG. 4 depicts a flowchart 400 of the operational steps of a method for identifying conflicts for roof truss members in building within the computing environment of FIG. 1, in accordance with one embodiment of the present invention. The method(s) and associated process(es) are now discussed, over the course of the following paragraphs, in accordance with one embodiment of the present invention.

The program(s) described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

In step 402, the conflict identification program 108 accesses the building model and the roof truss member required property values. The conflict identification program 108, through accessing the database or a third-party storage location receives the building model (or illustrations). The required property values for the roof truss members are used in the comparison between the actual roof truss member properties and the required roof truss member properties to determine if the difference (delta) is within the predetermined tolerance ranges.

In step 404, the conflict identification program 108 analyzes the model to identify the roof truss members. Based on the received model or image type, the conflict identification program 108 extracts the roof truss members from the other members and systems. In some embodiments where the model has all the members individually generated, the conflict program 108 is able to easily extract the roof truss members. Either from identifying the members first or identifying the roof truss assembly and then identifying the members within the roof truss. In instances where the model does not have each individual member created, the conflict identification program 108 analyzes the model or images to first determine which surfaces are roof versus walls or floors. This analysis is based on the data extracted from the model that identifies the measurements of the roof based on the measurements of the building.

In step 406, the conflict identification program 108 identify roof truss members. Once the conflict identification program 108 has identified the roof trusses, the conflict identification program 108 is able to identify the roof truss member individually so that the conflict identification program 108 is able to extract the necessary information related to each roof truss member. In some embodiments, the conflict identification program 108 identifies the position of the roof truss members relative to each other. For example, the ends of the roof truss are parallel, the top and bottom of the roof truss are parallel, and the web members of the roof truss are alternating in orientation but equal in length.

In step 406, the conflict identification program 108 determines the actual values for the roof truss member properties. These properties are related to all features of the roof truss member; length, height, width, thickness of material, orientation, position, cutouts, apertures, lips, flanges, Swedge, and the like. For example, the roof truss members position relative to the x, y, and x axes. In some embodiments, the limitation of the shipping vehicles sets a maximum length of the roof truss members. In some embodiments, the limitations of the manufacturing machines are used to set the required values. For example, the thickness of the material is a limitation on the roof truss members.

In some embodiments, the conflict identification program 108 determines the actual values for the Required length of the Top cord and Bottom cord is determined from center to center distance between the two walls and roof truss angle. The Required length of web members of the roof truss is determined by roof truss depth specified in Architectural drawings and from trigonometric calculation depending on the web pattern which is specified. For the roof truss dimensions are taken as a distance between center to center of wall. As per the start and end points of the roof truss, at the start and end of roof truss flat surface of members should be at outer side. And for Top cord and Bottom cord flat surface should be on outer side. From trigonometric calculation depending on the web pattern which is specified, locations where the web members are get connected with top and bottom cord can be obtained and from that spacing is calculated. Member Lip Cut/web cut is the standard tool operation in cold formed steel and is determined by the location where another cold formed steel member intersecting/connecting to it. Swedging, or when two cold formed steel members having same size are connecting to each other, then one member should be swedged into another member by some amount(tolerance).

In decision 408, the conflict identification program 108 determines if the roof truss member's actual property values are within the range of the required property values. The measured actual values are compared to the required values. This comparison assists in confirming that the roof truss members are of the proper dimensions and have the features in the proper locations so that when the roof truss is assembled the members line up, the features of the members are in the proper location, and the roof truss is assembled with little to no issues. If the conflict identification program 108 determines that an actual value of any properties of the roof truss member are outside the predetermined tolerance range of the property, the conflict identification program 108 creates the sick list and adds the identified member to the sick list.

In step 412, the conflict identification program 108 creates the sick list of the roof truss members which have issues. This list may be the identification of the members within the model as highlighted or identified from the other members. In some embodiments, the sick list is a list showing the actual values, the required values, and the differences between these two values (delta) and highlight the member data to alert a user.

In step 414, the conflict identification program 108 modifies the conflicting roof truss members. Through either an automated process or the selection of a user, the conflict identification program 108 is able to modify the conflicting roof truss members to fall within the tolerance range set for each property value which is conflicting. In some embodiments, this may require performing additional modifications to the roof truss member if the modification results in other features of the roof truss member becoming problematic and conflicting with the required values. For example, if a roof truss member is shortened and thus moving the position of an aperture, the aperture position may be adjusted to accommodate the shortening of the roof truss member.

Figure 5:
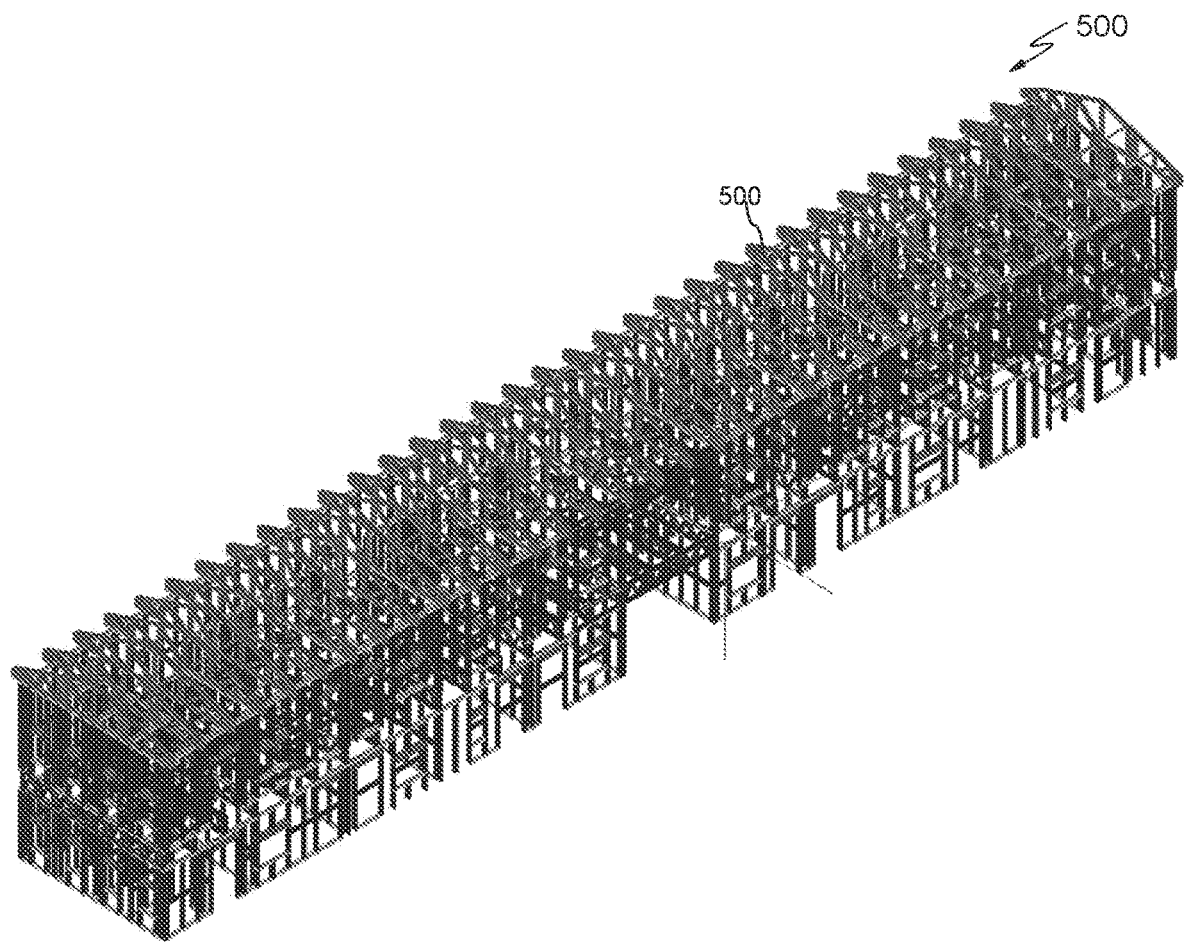
FIG. 5 depicts a structural frame model of a building, in accordance with one embodiment of the present invention.

FIG. 5 depicts a structural frame model 500 of a building, in accordance with one embodiment of the present invention. In the depicted embodiment, the structural frame model 500 is comprised of a set of members 502. This provides for the quickest processing as the members 502 are already generated and have their features and properties created.

Figure 6:
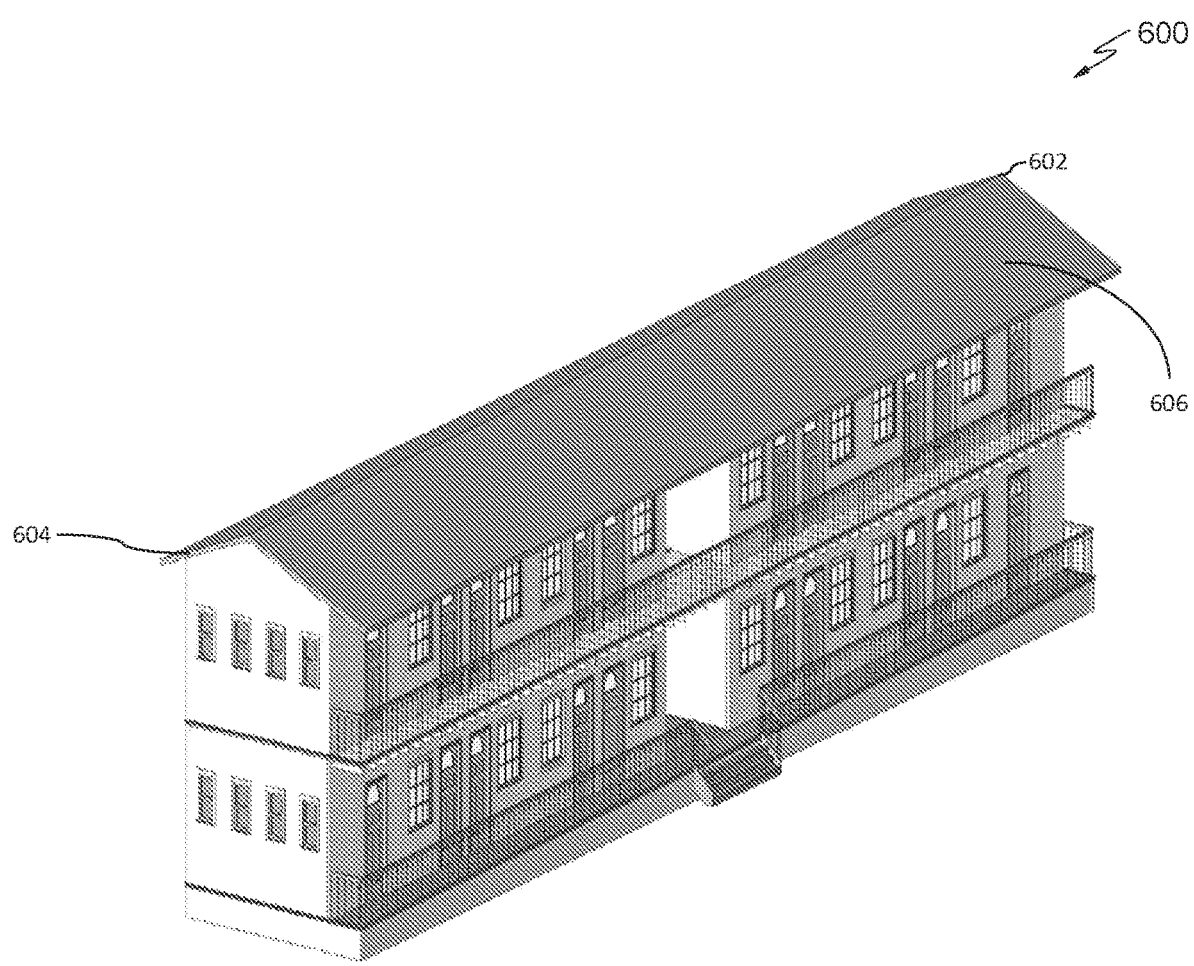
FIG. 6 depicts an architectural model of a building, in accordance with one embodiment of the present invention.

FIG. 6 depicts an architectural model 600 of a building, in accordance with one embodiment of the present invention. This model may include all the finishings of the building. The conflict identification program 108 may extract the peak 602 of the roof, the length or each side of the roof 604 and 606, or the overhang of the roof. Through the identification of these features, the conflict identification program 108 is able to isolate with greater accuracy the roof.

Figure 7A:
FIG. 7A depicts an illustration of an architectural building elevation, in accordance with one embodiment of the present invention.
Figure 7B:
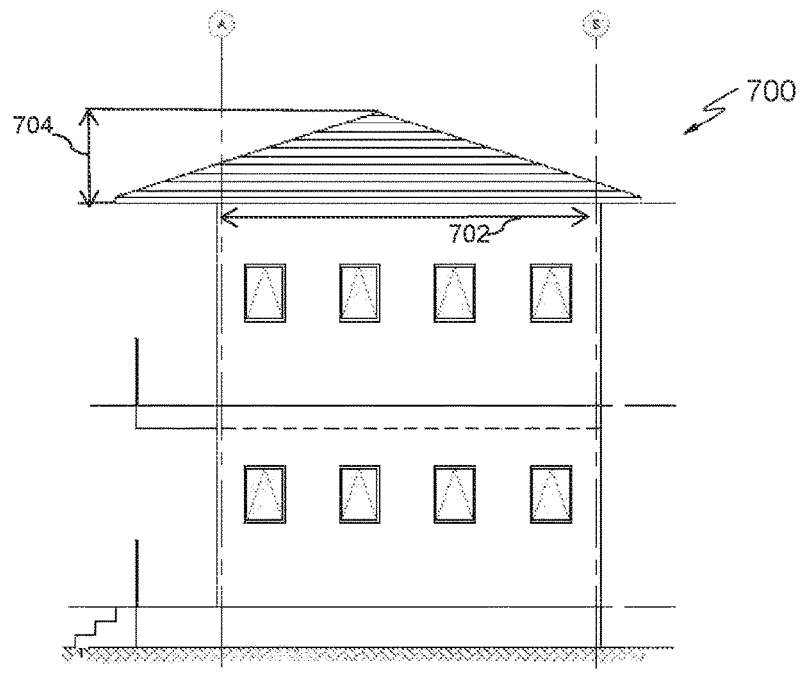
FIG. 7B depicts an illustration of an architectural building elevation, in accordance with one embodiment of the present invention.
Figure 8A:
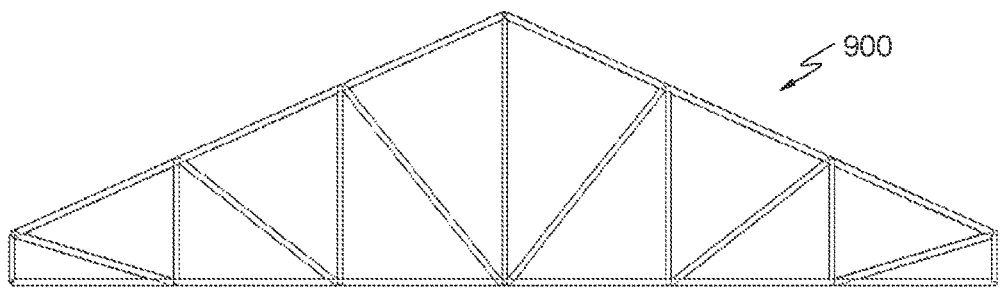
FIG. 8A depicts an illustration of a roof truss assembly, in accordance with one embodiment of the present invention.
Figure 8B:
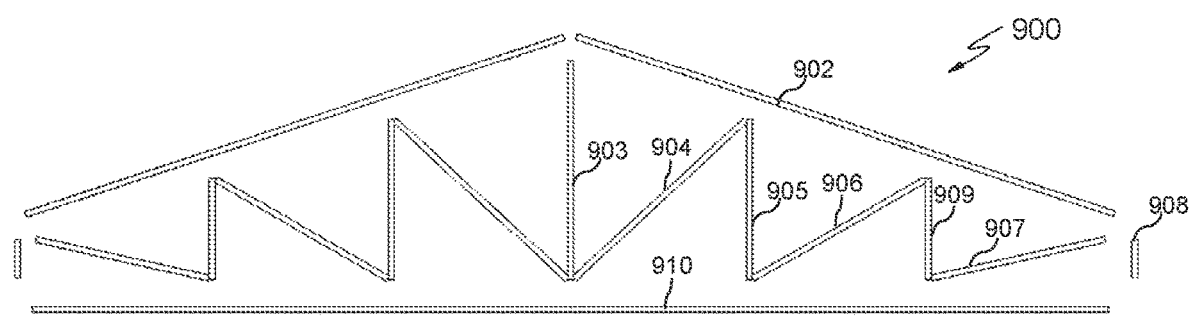
FIG. 8B depicts an illustration of the roof truss exploded view, in accordance with one embodiment of the present invention.
Figure 9A:
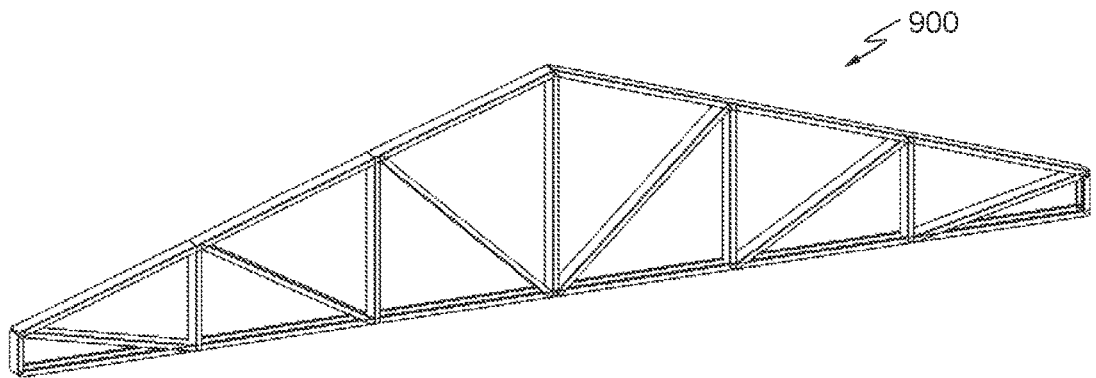
FIG. 9A depicts a model of a roof truss assembly view, in accordance with one embodiment of the present invention.
Figure 9B:
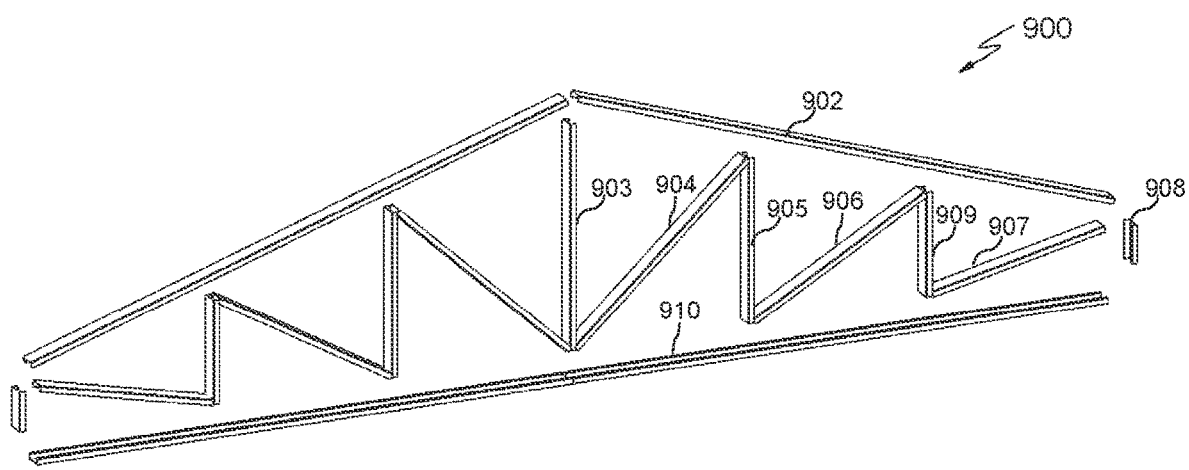
FIG. 9B depicts a model of the roof truss exploded view, in accordance with one embodiment of the present invention.

FIGS. 7A and 7B depict illustrations of architectural views of a building, in accordance with one embodiment of the present invention. The conflict identification program 108 uses these illustrations to analyse and identify the roof lines and the locations of the roof truss as well as the roof truss properties. For example, the height of the roof 704, the span of the roof 702, and other measurements and use various calculations to determine other key measurements of the roof.

FIGS. 8A, 8B, 9A, and 9B depicts images of a roof truss 900, in accordance with one embodiment of the present invention. The section of roof is comprised of top chords 902, bottom chords 910, and web bracings 903, 904, 905, 906, 907, and 908. The framework consists of posts, struts, and rafters. The sizes of these parts are determined by load, spacing, and span. A truss is placed under compression and tension but is designed not to bend. The conflict identification program 108 is able to identify each member and each member's properties.

Figure 10A:
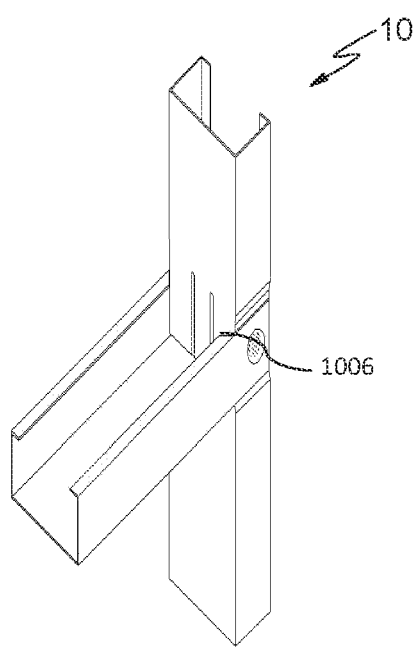
FIG. 10A depicts an image of an intersection between frame members, in accordance with one embodiment of the present invention.
Figure 10B:
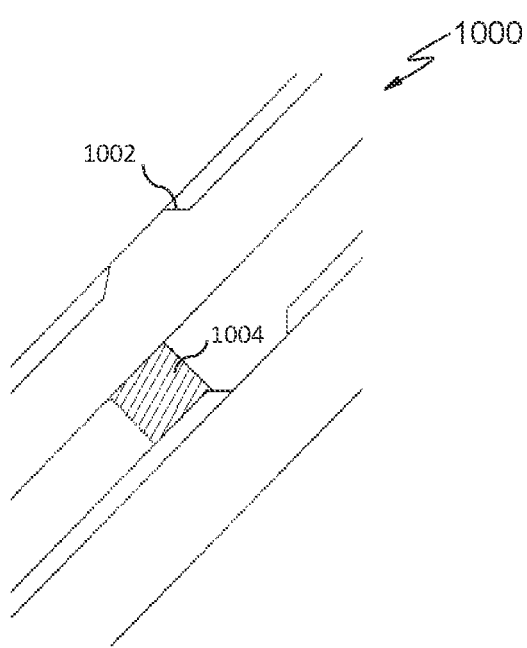
FIG. 10B depicts a section view of a frame member, in accordance with one embodiment of the present invention.

FIGS. 10A and 10B depicts an image of an intersection between two members, in accordance with one embodiment of the present invention. In the depicted embodiment, one roof truss member is notched 1002 to properly receive the other member. The notches are specific based on the member it is receiving. In some embodiments, the conflict identification program 108 identifies conflicts within each rooftruss where the members interact, this may be based on a notch which is too small to receive the other member or a notch which is to large and the members do not tightly fit together. For example, where members have lip cuts 1002 for each member is checked.

Member lip cuts are the standard tool operation in cold formed steel members and is determined by the location of another cold formed steel member connecting to it. Actual lip cuts 1002 of each cold formed steel member is determined from the model. Member web cuts 1004 are also checked. Member web cut is the standard tool operation in cold formed steel and is determined by the location of another cold formed steel member intersecting to it. Actual web cut 1004 of each cold formed steel member is determined from the model. Member swedge for each cold formed steel member is checked.

When two cold formed steel members having same size are connecting to each other, then one member should be swedged 1006 into another member. Required swedge is determined by the location of another cold formed steel member connecting to it. Actual swedge of each cold formed steel member is determined from 3D model. The swedge is also used to calculate and determine if there is a conflict among members of the roof truss.

Figure 11:
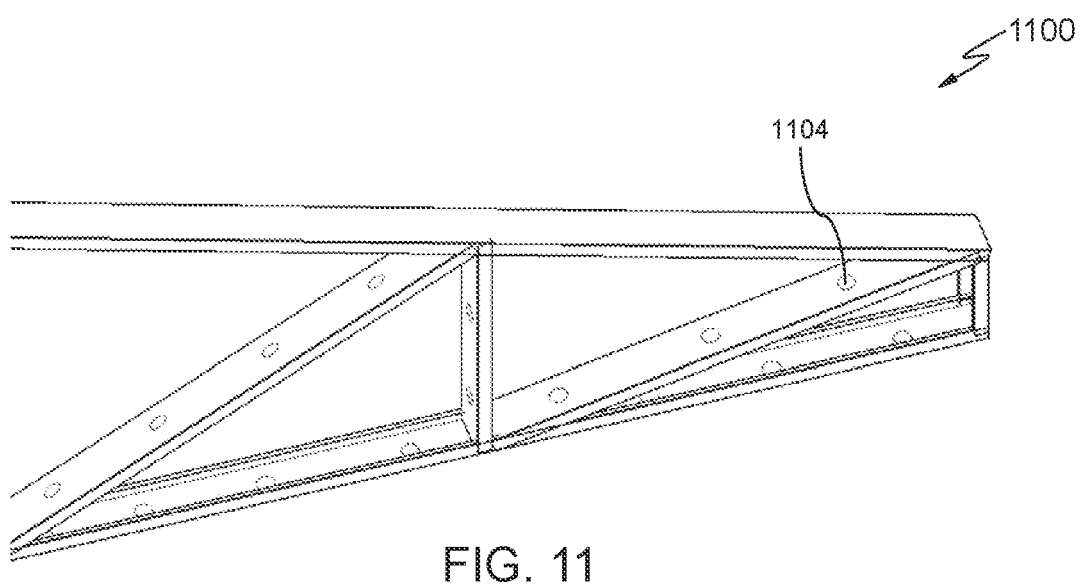
FIG. 11 depicts a model of service holes in roof truss assembly, in accordance with another embodiment of the present invention.

FIG. 11 depicts an image of a roof truss, in accordance with one embodiment of the present invention. Required locations and sizes of the service holes 1104 in each of the members for any mechanical unit, electrical unit or plumbing unit or to tie the ceiling rod is given as per respective drawings. Actual location and sizes of the service hole 1104 is determined from global x, y and z coordinates in 3d model. If any conflict is present in location and size of service hole the it is shown on the sick list.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

The foregoing descriptions of various embodiments have been presented only for purposes of illustration and description. They are not intended to be exhaustive or to limit the present invention to the forms disclosed. Accordingly, many modifications and variations of the present invention are possible in light of the above teachings will be apparent to practitioners skilled in the art. Additionally, the above disclosure is not intended to limit the present invention. In the specification and claims the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g. attached, adhered, joined) are to be construed broadly and may include intermediate members between a connection of elements and relative movement between elements. As such, joinder references do not necessarily infer that two elements are directly connected and in fixed relation to each other. Moreover, network connection references are to be construed broadly and may include intermediate members or devices between network connections of elements. As such, network connection references do not necessarily infer that two elements are in direct communication with each other. In some instances, in methodologies directly or indirectly set forth herein, various steps and operations are described in one possible order of operation, but those skilled in the art will recognize that steps and operations may be rearranged, replaced or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to the embodiments outlined above, various alternatives, modifications, variations, improvements and/or substantial equivalents, whether known or that are or may be presently foreseen, may become apparent to those having at least ordinary skill in the art. Listing the steps of a method in a certain order does not constitute any limitation on the order of the steps of the method. Accordingly, the embodiments of the invention set forth above are intended to be illustrative, not limiting. Persons skilled in the art will recognize that changes may be made in form and detail without departing from the spirit and scope of the invention. Therefore, the invention is intended to embrace all known or earlier developed alternatives, modifications, variations, improvements and/or substantial equivalent.

What is claimed is:

1. A computer implemented method for checking construability of a building comprising:
   accessing, by at least one processor, a model of the building, wherein the model is comprised of a plurality of members which form a structure of the building with a set of subsystems integrated into the building;
   analyzing, by at least one processor, the model to identify a frame, mechanical systems, electrical systems, and plumbing systems within the building;
   isolating, by at least one processor, a portion of the frame related to a set of roof trusses, wherein the roof trusses are comprised of roof truss members;
   identifying, by one or more processors, interfaces of the roof truss members based on an assembly of the roof truss;
   locating, by one or more processors, a series of services apertures for the roof truss members to interact with the mechanical, electrical, and plumbing systems based on the model design;
   determining a set of actual properties of each of the roof truss members associated with the located series of services apertures based on measurements, wherein the actual properties are related to spatial positioning and sizing data associated with the interaction;
   comparing, by at least one processor, the set of actual properties of the roof truss members with a tolerance of a set of required properties for each of the roof truss members associated with the located series of services apertures, wherein the tolerance of the set of required properties are determined by a set of limitations; wherein if the set of actual properties is not within the tolerance of the set of required properties, the roof truss members associated with the located series of services apertures are identified as conflicting members;

generating, by at least one processor, a list of all conflicting members;

modifying, by at least one processor, the actual properties of the list of all conflicting members to within the tolerance of the set of required properties;

performing, by at least one processor, additional modification automatically if the modification of the list result other conflict occurs in different roof truss member and providing, by at least one processor, data related to the conflicts and modifications to notify user before the construction of the building.

2. The computer implemented method of claim 1, further comprising, altering, by one or more processors, the actual properties of the roof truss member based on the modification to correct one of the conflicts.

3. The computer implemented method of claim 1, further comprising, analyzing, by one or more processors, the model to determine the set of required properties of the roof trusses.

4. The computer implemented method of claim 1, wherein each roof truss member is analyzed for spatial positioning.

5. The computer implemented method of claim 1, wherein the set of limitations are set based on manufacturing machines and shipping vehicles.

6. A computer program product comprising:

a non-transitory computer readable storage device readable by one or more processing circuit and storing instructions for execution by one or more processor for performing a method for checking construability of a building comprising:

accessing a model of the building, wherein the model is comprised of a plurality of members which form a structure of the building with a set of subsystems integrated into the building;

analyzing the model to identify a frame, mechanical systems, electrical systems, and plumbing systems within the building;

isolating a portion of the frame related to a set of roof trusses, wherein the roof trusses are comprised of roof truss members;

identifying interfaces of the roof truss members based on an assembly of the roof truss;

locating a series of services apertures for the roof truss members to interact with the mechanical, electrical, and plumbing systems based on the model design;

determining a set of actual properties of each of the roof truss members associated with the located series of services apertures based on measurements, wherein the actual properties are related to spatial positioning and sizing data associated with the interaction;

comparing the set of actual properties of the roof truss members with a tolerance of a set of required properties for each of the roof truss members associated with the located series of services apertures, wherein the tolerance of the set of required properties are determined by a set of limitations; wherein if the set of actual properties is not within the tolerance of the set of required properties, the roof truss members associated with the located series of services apertures are identified as conflicting members;

generating a list of all conflicting members;

modifying the actual properties of the list of all conflicting members to within the tolerance of the set of required properties;

performing additional modification automatically if the modification of the list result other conflict occurs in different roof truss member and providing data related to the conflicts and modifications to notify user before the construction of the building.

7. The computer program product of claim 6, wherein each roof truss member is analyzed for spatial positioning.

8. The computer program product of claim 6, further comprising, altering the actual properties of the roof truss member based on the modification to correct one of the conflicts.

9. The computer program product of claim 6, further comprising, analyzing, by one or more processors, the model to determine the set of required properties of the roof trusses.

10. The computer program product of claim 6, wherein the set of limitations are set based on manufacturing machines and shipping vehicles.

11. A system comprising:

a memory; one or more processors in communication with the memory; program instructions executable by the one or more processors via the memory to perform a method for checking construability of a building, the method comprising:

accessing a model of the building, wherein the model is comprised of a plurality of members which form a structure of the building with a set of subsystems integrated into the building;

analyzing the model to identify a frame, mechanical systems, electrical systems, and plumbing systems within the building;

isolating a portion of the frame related to a set of roof trusses, wherein the roof trusses are comprised of roof truss members;

identifying interfaces of the roof truss members based on an assembly of the roof truss:

locating a series of services apertures for the roof truss members to interact with the mechanical, electrical, and plumbing systems based on the model design;

determining a set of actual properties of each of the roof truss members associated with the located series of services apertures based on measurements, wherein the actual properties are related to spatial positioning and sizing data associated with the interaction;

comparing the set of actual properties of the roof truss members with a tolerance of a set of required properties for each of the roof truss members associated with the located series of services apertures, wherein the tolerance of the set of required properties are determined by a set of limitations; wherein if the set of actual properties is not within the tolerance of the set of required properties, the roof truss members associated with the located series of services apertures are identified as conflicting members;

generating a list of all conflicting members;

modifying the actual properties of the list of all conflicting members to within the tolerance of the set of required properties;

performing additional modification automatically if the modification of the list result other conflict occurs in different roof truss member and providing data related to the conflicts and modifications to notify user before the construction of the building.

12. The system of claim 11, wherein each roof truss member is analyzed for spatial positioning.

13. The system of claim 11, further comprising, altering, by one or more processors, the actual properties of the roof truss member based on the modification to correct one of the conflicts.

14. The system of claim 11, further comprising, analyzing, by one or more processors, the model to determine the set of required properties of the roof trusses.

15. The system of claim 11, wherein the set of limitations are set based on manufacturing machines and shipping vehicles.

\* \* \* \* \*